(12) United States Patent
Tustaniwskyj et al.

(10) Patent No.: US 11,802,908 B2
(45) Date of Patent: Oct. 31, 2023

(54) ALIGNMENT MECHANISM

(71) Applicant: Delta Design, Inc., Poway, CA (US)

(72) Inventors: Jerry Ihor Tustaniwskyj, Mission Viejo, CA (US); James Wittman Babcock, Escondido, CA (US)

(73) Assignee: DELTA DESIGN, INC., Poway, CA (US)

(*) Notice: Subject to any disclaimer, the term of this patent is extended or adjusted under 35 U.S.C. 154(b) by 581 days.

(21) Appl. No.: 16/866,062

(22) Filed: May 4, 2020

(65) Prior Publication Data
US 2021/0088579 A1 Mar. 25, 2021

Related U.S. Application Data

(63) Continuation of application No. 15/354,250, filed on Nov. 17, 2016, now abandoned, which is a continuation of application No. 13/048,714, filed on Mar. 15, 2011, now Pat. No. 9,500,701.

(60) Provisional application No. 61/314,999, filed on Mar. 17, 2010.

(51) Int. Cl.
| | |
|---|---|
| *F28F 7/00* | (2006.01) |
| *G01R 31/28* | (2006.01) |
| *H01L 23/46* | (2006.01) |
| *H01L 23/467* | (2006.01) |
| *H01L 23/427* | (2006.01) |
| *H01L 23/473* | (2006.01) |

(52) U.S. Cl.
CPC ........ *G01R 31/2874* (2013.01); *H01L 23/427* (2013.01); *H01L 23/46* (2013.01); *H01L 23/467* (2013.01); *H01L 23/473* (2013.01); *H01L 2924/0002* (2013.01)

(58) Field of Classification Search
CPC ... G01R 31/2874; H01L 23/427; H01L 23/46; H01L 23/467; H01L 23/473; H01L 2924/0002
USPC ...................................................... 165/80.2
See application file for complete search history.

(56) References Cited

U.S. PATENT DOCUMENTS

| | | | |
|---|---|---|---|
| 3,806,801 | A | 4/1974 | Bove |
| 4,740,057 | A | 4/1988 | Dezso |
| 4,791,983 | A | 12/1988 | Nicol et al. |
| 4,837,507 | A | 6/1989 | Hechtman |
| 5,967,798 | A | 10/1999 | Tustaniwskyj et al. |
| 6,116,331 | A | 9/2000 | Tustaniwskyj et al. |
| 6,243,944 | B1 * | 6/2001 | Tustaniwskyj ...... H01L 21/4882 324/754.04 |
| 6,809,543 | B1 * | 10/2004 | Tustaniwskyj ..... G01R 31/2891 324/750.09 |
| 7,100,389 | B1 | 9/2006 | Wayburn et al. |
| 7,199,597 | B2 | 4/2007 | Tustaniwskyj et al. |
| 7,243,704 | B2 | 7/2007 | Tustaniwskyj et al. |

(Continued)

*Primary Examiner* — Claire E Rojohn, III
(74) *Attorney, Agent, or Firm* — FOLEY & LARDNER LLP

(57) ABSTRACT

An alignment mechanism is disclosed which includes a mount, a beam having a first end affixed to the mount and a second end. The beam is an order of magnitude more rigid along its longitudinal axis than along an axis orthogonal to its longitudinal axis. The second end of the beam is affixed to a first device having a surface configured to contact a second device. The beam applies a normal force component to the second device through the first device and allows movement at the second end in directions orthogonal to the normal force component.

28 Claims, 5 Drawing Sheets

(56) References Cited

U.S. PATENT DOCUMENTS

| | | | |
|---|---|---|---|
| 7,373,967 B1 | 5/2008 | Tustaniwskyj et al. | |
| 7,443,185 B2 | 10/2008 | Suhir | |
| 7,471,096 B2 | 12/2008 | Kohashi et al. | |
| 8,490,679 B2 * | 7/2013 | Campbell | H05K 7/203 |
| | | | 257/714 |
| 8,757,250 B2 | 6/2014 | Stuckey | |
| 9,030,658 B1 * | 5/2015 | Morgan | G01N 21/9501 |
| | | | 356/237.5 |
| 9,466,551 B1 * | 10/2016 | Reist | F28D 15/0241 |
| 10,854,532 B1 * | 12/2020 | Byagowi | F28F 7/02 |
| 2005/0257532 A1 | 11/2005 | Ikeda et al. | |
| 2006/0037739 A1 | 2/2006 | Utsunomiya | |
| 2006/0102999 A1 | 5/2006 | Tustaniwskyi et al. | |
| 2010/0163217 A1 | 7/2010 | Stuckey | |
| 2018/0218926 A1 * | 8/2018 | Stuckey | H01L 21/67103 |
| 2020/0060019 A1 * | 2/2020 | Tustaniwskyj | H05B 3/20 |
| 2020/0185306 A1 * | 6/2020 | Xiao | H01L 23/467 |
| 2022/0173014 A1 * | 6/2022 | Xiao | H01L 23/467 |
| 2022/0214396 A1 * | 7/2022 | Scocchetti | G01R 31/2874 |
| 2023/0003786 A1 * | 1/2023 | Tustaniwskyj | G01R 31/2875 |

* cited by examiner

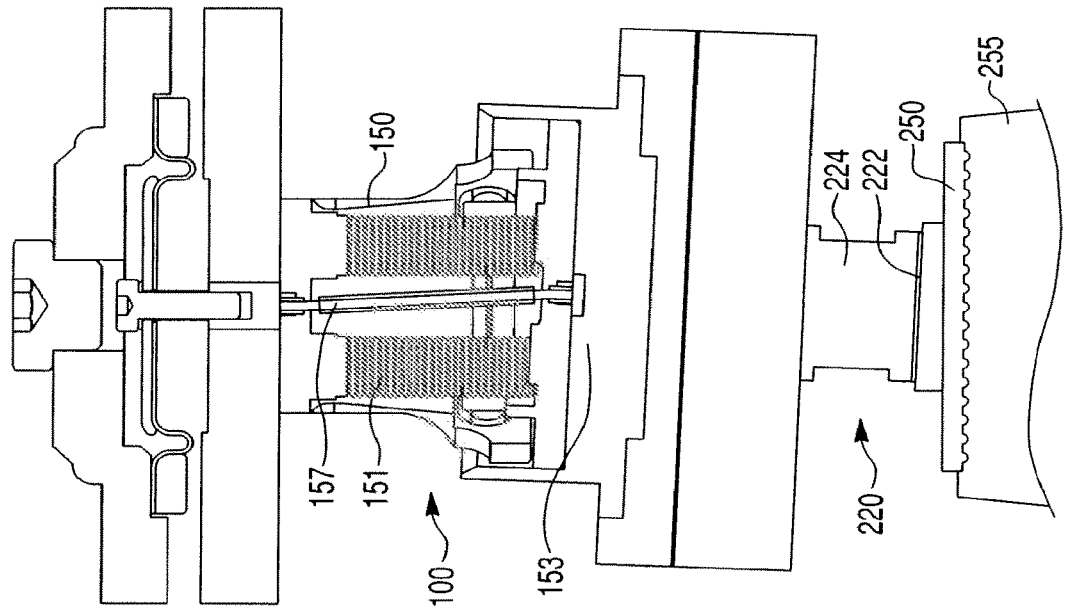
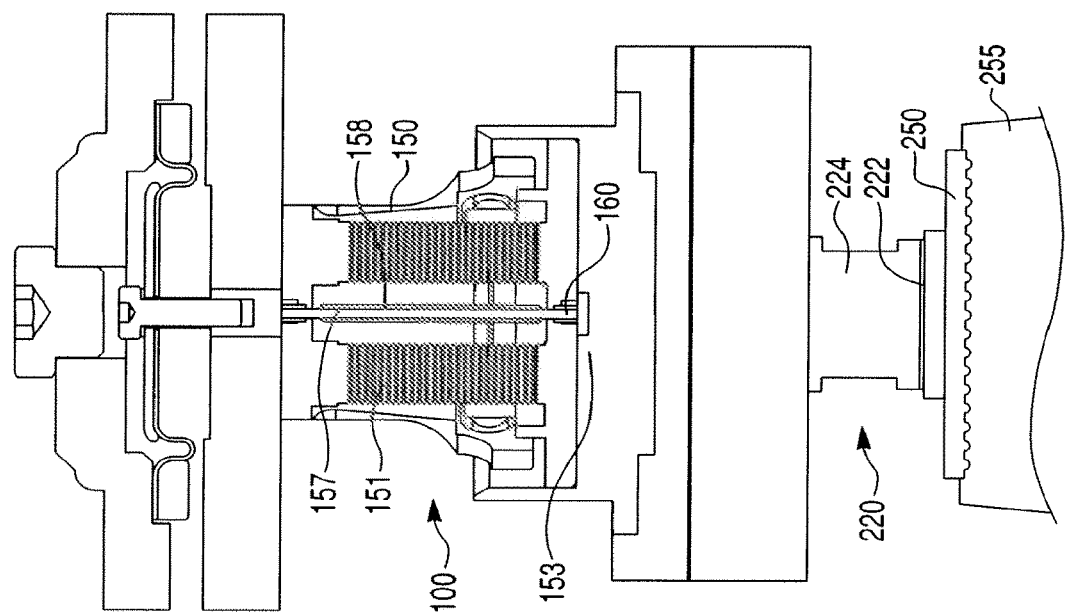

ALIGNMENT MECHANISM

CROSS-REFERENCE TO RELATED APPLICATIONS

This application is a continuation of U.S. application Ser. No. 15/354,250, filed Nov. 17, 2016; which is a continuation of U.S. application Ser. No. 13/048,714, filed Mar. 15, 2011; which claims the benefit of U.S. Provisional Application No. 61/314,999, filed Mar. 17, 2010, the disclosures of both of which are incorporated herein by reference in their entirety.

BACKGROUND

The disclosed embodiments relate generally to an alignment mechanism, and more particularly, to a mechanism that may be utilized to provide a normal force component to a device, such as a thermally controlled semiconductor device.

When testing a semiconductor device, a thermal control device may be used to regulate the temperature of the device while the device is being tested. The thermal control device may include, for example, a heat exchanger, a heating device (such as a heated plate or a Peltier device), or a cooling device. Further, device temperature may be controlled passively or actively based on feedback, such as feedback associated with present or historical device temperature or power consumption. Thermal control devices may be used to cool or heat a device, or may be used to maintain a device at a substantially constant temperature.

One type of thermal control device utilizes a heat exchanger, which may include a heat sink or active heating/cooling elements to maintain the device at a setpoint temperature during testing. The heat exchanger may be incorporated into a thermal head that applies a force to the device. The force is provided to ensure that there is proper heat transfer between the thermal head and the device during testing. While sufficient force is required to maximize thermal transfer, the contact force must also be controlled to avoid damage to the device.

In such environments, there may be external forces that cause the contact force on the device applied by a thermal head to be applied off center on the device. Such external forces may include an off-center mass of the thermal head combined with gravity (e.g., horizontal plunging of a device under test into a test socket opposite to the thermal head), and fluid conduits, such as bellows, with varying spring rates and/or free lengths. The applied force of the thermal head must be large enough to overcome these external forces. Further, it may be beneficial for heat transfer purposes if contact surfaces of the device and the thermal head are in intimate and even contact, preferably oriented parallel to each other, in order to reduce thermal resistance across contacting surfaces, which is a function of the quality of the contact (e.g., contact pressure, alignment, surface flatness, materials, etc.).

By way of example, FIG. 1 illustrates a control system for maintaining the temperature of a device, such as an integrated circuit chip 10 (IC-chip), near a setpoint (e.g., approximate real-world operating temperature, room temperature, optimal operating temperature) while the IC-chip is connected to a test socket 24. Such a system is described in U.S. Pat. No. 7,199,597, the contents of which are hereby incorporated in their entirety. The system includes an electric heater 20 and an evaporator 21 having an input conduit 21a and an output conduit 21b, which together form a heat exchanger.

Temperature of the IC-chip 10 is maintained near the setpoint using two feedback loops in the control system of FIG. 1. A first feedback loop comprises a control circuit 26, a power supply 25, and the electric heater 20. The first feedback loop compensates for changes in power dissipation in the IC-chip. The second feedback loop comprises a control circuit 27 for a valve 22 and the evaporator 21. The control circuit 27 generates a signal SFv on conductors 22b in response to signals SPH, STE, and SP, which are received on conductors 25a, 21d, and 26a, as further explained in U.S. Pat. No. 7,199,597. In order to control IC-chip temperature in such a system or in similar systems using conductive heat transfer, it is beneficial for effective heat transfer to maintain a uniformly distributed compressive force between contact surfaces of the IC-chip 10 and the heat exchanger, such as the electric heater 20.

Generally, prior art methods attempt to ensure proper heat transfer between the thermal head and the IC-chip by applying a force through a sliding interface within the heat exchanger. The sliding interface allows the contact surface of the heat exchanger to adjust laterally (i.e., to slide) to compensate for misalignment with the contact surface of the IC-chip. Such systems rely on low frictional forces within the sliding interface to allow less restricted movement in directions perpendicular (e.g., lateral, transverse) to the direction of the applied force (e.g., normal, longitudinal). As applied forces increase, however, the frictional forces within the sliding interface proportionally increase. This increase of the frictional forces between the IC-chip and the thermal head results in decreased ease of motion.

According to at least one theoretical model, if a normal load is applied between two surfaces, there is a limit as to the angle that the two surfaces may be oriented off of a plane perpendicular to the normal load, before the two surfaces slip relative to one another. The angle is a function of the coefficient of friction between the two surfaces, which may be relatively low for an IC-chip and a heat exchanger. As such, a relatively low coefficient of friction may lead to slipping of the surfaces.

One prior art assembly that utilizes a heat exchanger for thermal control of a device is described in U.S. Pat. No. 6,116,331 ("the '331 patent"). The '331 patent discloses a heat exchanger that is held spaced-apart from a frame by a leaf spring, which extends from one side of the frame to the other side of the frame. The heat exchanger contacts the leaf spring near the middle of the leaf spring. The leaf spring moves the heat exchanger so that the heat exchanger can be placed flush against a device. The '331 patent relies on the heat exchanger contact points with the leaf spring to create a low friction interface. Additionally, the leaf spring consumed a large volume of space in a lateral direction.

U.S. Pat. No. 4,791,983 discloses an assembly in which a coil spring presses a planar surface of a liquid cooling jacket against a planar surface of a device. The coil spring is compressed in a direction perpendicular to the planar surface of the liquid cooling jacket and the device to squeeze the planar surfaces together and thereby lower thermal resistance therebetween. The assembly according to the '983 patent, however, is designed for use in an operational environment, such as a server system, and is not adapted for systems in which the device is repeatedly removed from contact with the heat exchanger.

U.S. Pat. Nos. 7,243,704 and 7,373,967, the contents of which are hereby incorporated by reference in their entireties, describe systems utilizing a coil spring to exert a compressive force on the face of a heat exchanger and the surface of a device under test, such as an IC-chip. These systems are adapted for use in a test assembly in which an IC-chip is inserted into a socket of a test device, and the IC-chip is maintained near a setpoint by a heat exchanger during testing. In such systems, rotations (e.g., pivoting, misalignment) of the thermal head mating with the IC-chip may cause the applied force to be off center. If the applied force is off center, the resulting pressure distribution between the thermal head and IC-chip may not be uniform, possibly causing stress concentrations and varying temperature distributions due to varied thermal resistance (a function of contact pressure) across the contact between the heat exchanger and IC-chip. If the applied force is too far off center, the thermal head may even tilt or fall off of the device because the center of force of the thermal head will be off of the support base provided by the device.

It would be advantageous to provide an alignment mechanism that allows for improved centrality of the contact force between a first device, such as a thermal control unit or heat exchanger, and a surface of a second device, such as a semiconductor device, an IC-chip, etc., where the alignment mechanism permits lateral movement of the first device so as to accommodate angular misalignment between contact surfaces of the first and second devices.

SUMMARY

An alignment mechanism according to an embodiment of the invention includes a mount, a beam having a first end affixed to the mount, and a second end. The beam is an order of magnitude more rigid along its longitudinal axis than along an axis orthogonal to its longitudinal axis. The second end of the beam is affixed to a first device having a surface configured to contact a second device. The beam applies a normal force component to the second device through the first device and allows movement at the second end in directions orthogonal to the normal force component, without slipping between the first and second devices.

According to one aspect of the invention, the beam is a wire that is load bearing. The wire (or other beam) may be provided within a tube configured to prevent the wire from buckling beyond a predetermined amount. Theoretically, if unrestrained and under sufficient load, the wire may buckle in a various modes that deform the wire in a U-shape (first mode), an S-shape (second mode), etc. However, the tube is configured to constrain the wire, to prevent excessive deformations due to buckling.

According to another aspect of the invention, the first device may comprise a thermal control device, such as a heat exchanger or air cooled heat sink, and the second device may comprise a semiconductor device. In certain embodiments, the heat exchanger may include a fluid channel through which fluid flows to regulate the temperature of the semiconductor device while the surface of the heat exchanger is in contact with the semiconductor device. The fluid channel may run through a heat sink. Further, the heat exchanger may include a heater element disposed between the heat sink and the surface of the heat exchanger that contacts the device. An evaporator may be utilized to cool the device.

In certain embodiments, the mount is coupled to a housing that is affixed to a handler device, which receives a semiconductor device, presents the device to a test unit for testing, and removes the device from the test unit after testing. In some embodiments, the mount is coupled to a housing via a piston configured to move the first device in contact with the second device. In certain embodiments, the mount is attached to a frame that includes a stop member configured to prevent displacement of the first device beyond a predetermined distance in a direction orthogonal to the normal force component.

In certain embodiments, a liquid is supplied to and received from a fluid channel via compressible inlet bellows and compressible outlet bellows, which are preferably compliant in some such embodiments. Preferably in some such embodiments, the inlet and outlet bellows are spaced equally from the beam.

BRIEF DESCRIPTION OF THE DRAWINGS

These and other features, aspects, and advantages of the disclosed embodiments will become apparent from the following description, appended claims, and the accompanying exemplary embodiments shown in the drawings, which are briefly described below.

FIGS. 5(a) and 5(b) are cross-sectional views of a thermal head assembly that may be used for applying a centralized normal force component to a semiconductor device.

DETAILED DESCRIPTION OF THE PREFERRED EMBODIMENTS

Figure 1:
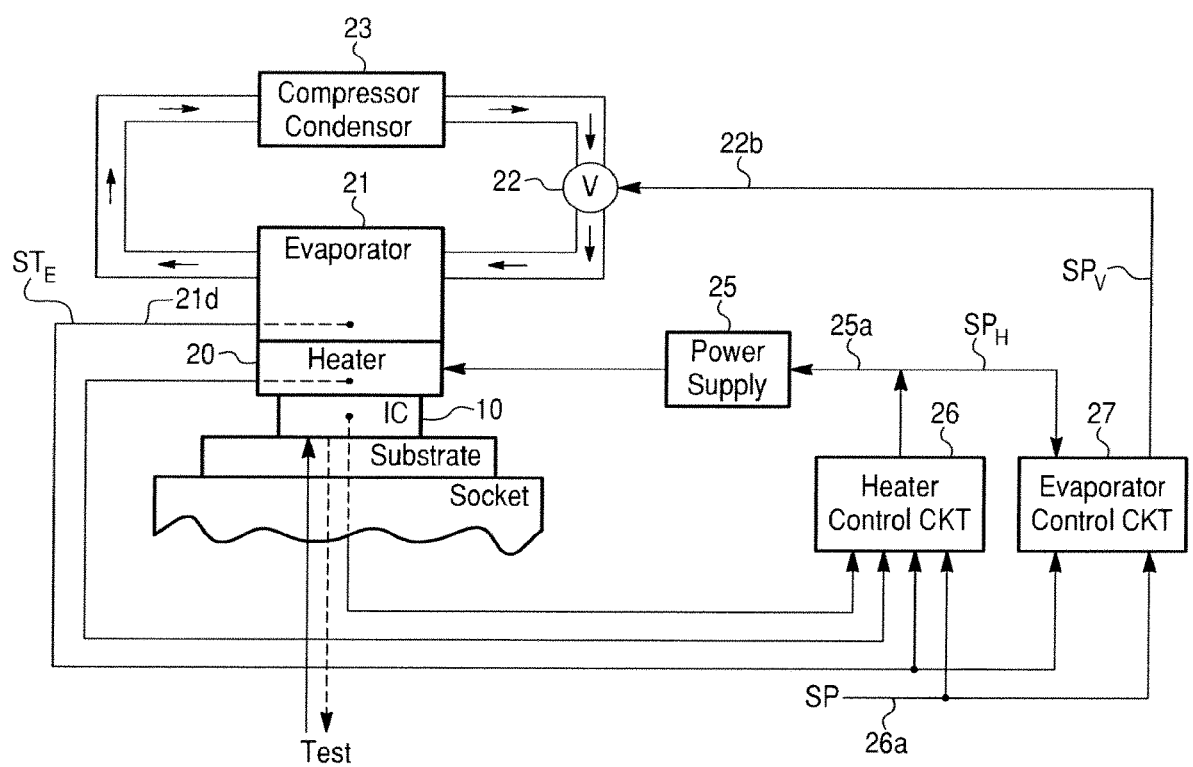
FIG. 1 shows a control system for maintaining the temperature of an IC device near a setpoint, which includes a heat exchanger that may be configured according to the present invention.

Preferred embodiments are illustrated in the drawings. It should be understood that the detailed embodiments illustrated in the figures are merely exemplary. Various modifications may be made to the examples described below without departing from the scope of the invention. For example, although in the illustrated embodiment a mechanism is described for applying a downward force onto a semiconductor device, it will be understood that a similar mechanism could be modified to provide a force in an upward direction toward a device. Further, it will be understood that various fasteners and seals illustrated in the drawings could be modified or omitted. Other modifications will be apparent to those skilled in the art.

Figure 2:
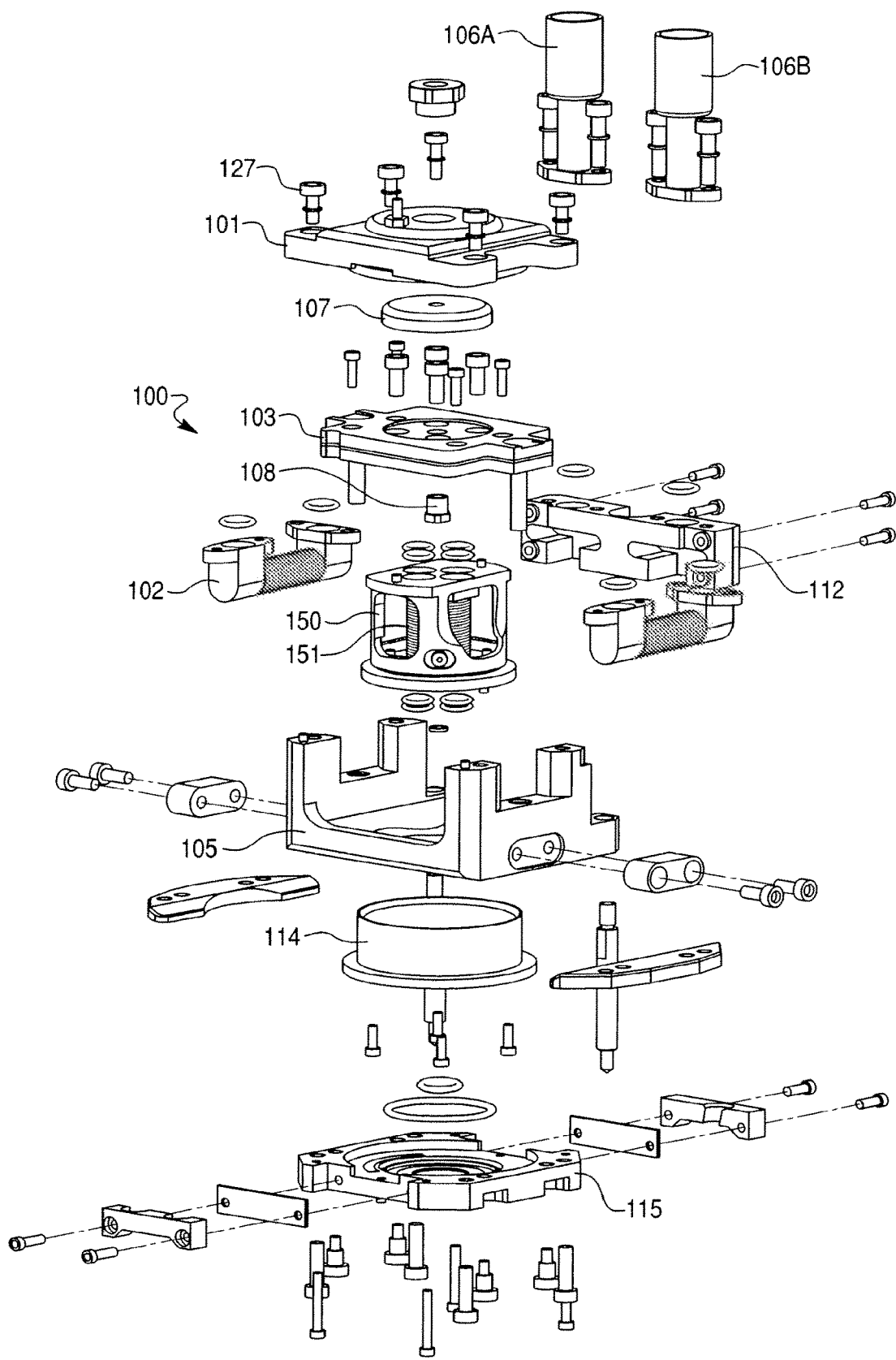
FIG. 2 is an exploded perspective view of a thermal head assembly, including an alignment assembly according to an embodiment of the present invention.

FIG. 2 is an exploded perspective view of a thermal assembly 100 (e.g., heat exchanger, temperature control device). The thermal assembly 100 includes an alignment mechanism 150, described in greater detail below. The alignment mechanism 150 attaches to a base manifold 103 via an insert 108 and screws 127. The upper surface of the base manifold 103 has a recess that receives a piston 107. The other end of the piston 107 is received within a corresponding recess on a bottom surface of die force actuator 101. The die force actuator 101 responds to pneumatic or hydraulic control to exert an upward or downward force to raise and lower the alignment mechanism. In various contemplated embodiments, a die force actuator uses a hydraulic actuator (e.g., hydraulic cylinder), mechanical actuator (e.g., rotation of a screw thread to extend or retract a scissor jack), electrical actuator (e.g., solenoid), or another form of actuator to apply a load.

Liquid (e.g., coolant) at a substantially constant temperature is supplied to, and removed from the thermal assembly 100 via respective hoses 106A and 106B. The hoses connect to a support 112 having two fluid channels. The fluid channels connect to horizontal inlet and outlet bellows 102, which extend the fluid channels to communication with the base manifold 103. The liquid flows through these fluid channels and the inlet and outlet bellows 151 of the alignment assembly 150, as described below. The fluid channels continue from the bellows 151 to a lower manifold 114 and a flow adapter assembly 115. The liquid enters a thermal head (see generally heat sink 224 as shown in FIG. 5a) and returns through the flow adapter assembly 115 and lower manifold 114.

The die force actuator 101 is attached by screws 127 to a support 105, which constitutes part of a frame for the thermal assembly 100. Horizontal support beams are attached to sides of the support 105. The thermal assembly 100 can be affixed to a handler device (not shown) using the horizontal supports 105. In this way the thermal assembly 100 may be moved in the horizontal plane. Further, the die actuator 101 may be used to move the thermal assembly 100 vertically.

As discussed further below, the thermal assembly 100 may include a heat exchanger (see, e.g., heat sink 224 and heating element 222 as shown in FIG. 5a). During operation, the thermal assembly 100 may be positioned above a device, such as an IC-chip, material to be tested, etc. (see, e.g., semiconductor device 250 as shown in FIG. 5a) and lowered so that the heat exchanger contacts a top surface of the device. The handler receives devices to be tested, presents the devices to a test apparatus, and removes the devices after testing. By using thermal assembly 100 during testing, the temperature of the device may be controlled. While it is particularly advantageous to use the alignment assembly 150 disclosed herein in such an environment, it will be appreciated that the alignment assembly 150 may be used in other environments where two bodies come into compressive contact with one another and alignment of contact surfaces between the two bodies is desired.

Figure 3:
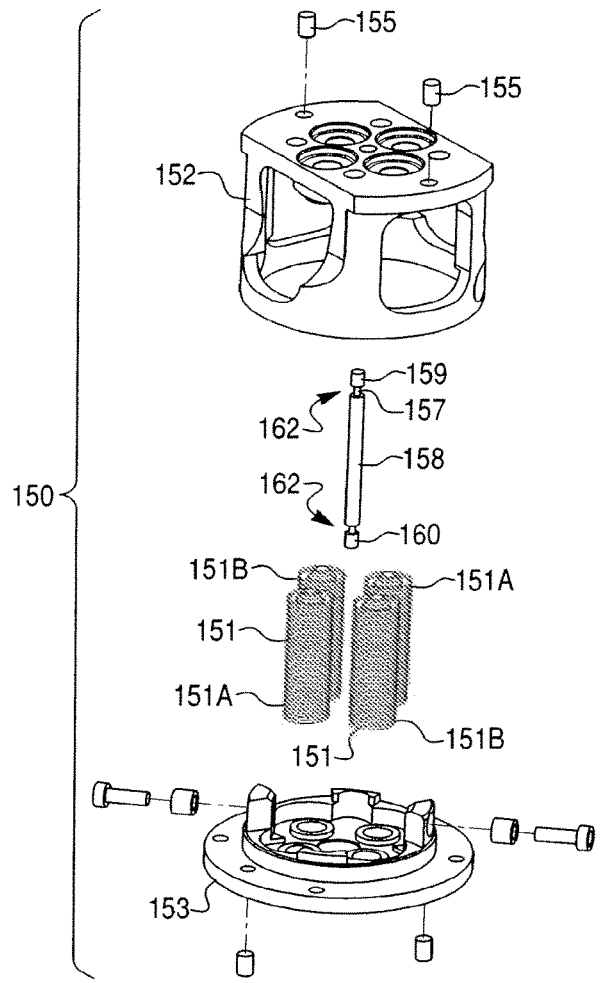
FIG. 3 is an exploded perspective view of the alignment assembly of FIG. 2.

FIG. 3 is an exploded view of the alignment assembly 150 according to one embodiment. The alignment assembly 150 includes a top plate 152 and a bottom plate 153. A pair of dowel pins 155 are received in openings in the top plate 152.

In accordance with some embodiments of the invention, the alignment assembly 150 includes a beam (e.g., rod, member) having a first end 159 attached to a mount 161 (see generally the top plate 152 shown in FIGS. 4a and 4b) and a second end 160. In some embodiments, the beam is formed from an isotropic material, such as a solid, rigid beam. In some such embodiments, the beam is coupled to joints, bearings, bushings, or gimbals that allow for rotation and/or displacement of the beam. According to an exemplary embodiment, the beam is at least partially nested in (e.g., extending through, positioned in) a tube 158, frame, or other reinforcement structure.

In some embodiments, the beam is a wire 157 (e.g., rod, solid beam) formed from a solid material, such as steel. In other contemplated embodiments, the wire 157 (e.g., metal cable) may be formed from an integration of filaments providing for anisotropic properties of the wire 157. In still other embodiments, a rod formed from continuous fiber composites or other materials may be used to serve as a member having anisotropic properties. Generally, the wire 157 or other member of the beam is at least an order of magnitude more rigid along its longitudinal axis than its cross-section. In some such embodiments, the material, structure, and geometry of the wire 157 is such that the force required to produce a compressive deflection in the longitudinal axis of the wire 157 is at least ten times greater than the force required to produce a bending deflection of equal magnitude on an end of the wire 157, such as at least one-hundred times greater.

In the particular example illustrated in FIG. 3, the beam comprises the wire 157 that is disposed within the tube 158, which is cylindrical, and which provides enhanced rigidity to a segment (e.g., section, subsection, central portion) of the wire 157. The tube 158 limits the degree to which the wire 157 may buckle when compressive forces are applied to the ends 159, 160. In other contemplated embodiments, the tube 158 is otherwise shaped (e.g., rectilinear) or another reinforcement structure is used (e.g., truss).

As illustrated in FIG. 3, in this example, the tube 158 has a length shorter than the wire 157, providing gaps 162 between ends of the tube 158 and ends 159, 160 of the wire 157 proximate to either end 159, 160 of the wire 157. The portion of the wire 157 extending beyond the tube is less restricted, and may bend. The length of the of the wire 157 extending from the beam varies as a function of the material, structure, and geometry of the wire 157, but in some embodiments is short enough to avoid buckling at the given loads during operation of the thermal assembly 100. As such, the ends of the wire 157 are configured to serve as joints that provide little resistance to small rotations (e.g., less than 15-degrees) of the beam about the joints.

As illustrated in FIG. 3, the first end 159 of the wire attaches to the top plate 152. The second end 160 of the wire 157 attaches to the bottom plate 153. As discussed below, the wire 157, with the support of the tube 158, is stiff enough to transmit a force that is normal to the surface of the device under test (e.g., normal force, longitudinal load, compressive force) along the lengthwise axis of the wire 157 without the wire 157 buckling, but flexible enough to allow movement in all directions orthogonal to the direction of the normal force component (e.g., all directions parallel to the surface of the device under test), as well as small bending rotations. As discussed below, the normal force, applied to the bottom plate 153 by the wire 157, is transferred to the bottom surface of the bottom plate 153, to which may be attached a thermal control device, such as a heat exchanger. In such embodiments, this force then maintains contact between the heat exchanger and the device under test, such as a semiconductor device under test.

Figure 4A:
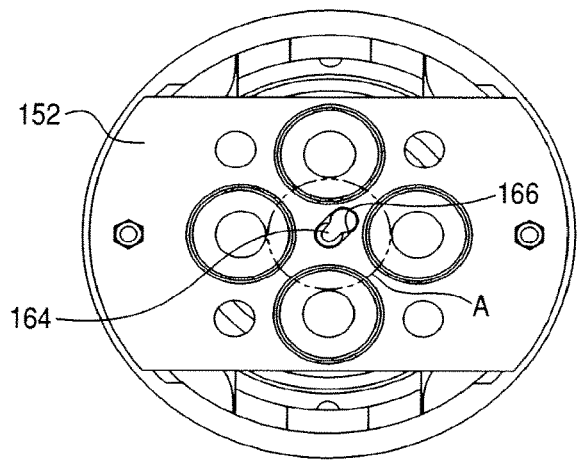
FIG. 4(a) is a top view of the alignment assembly of FIG. 3.
Figure 4B:
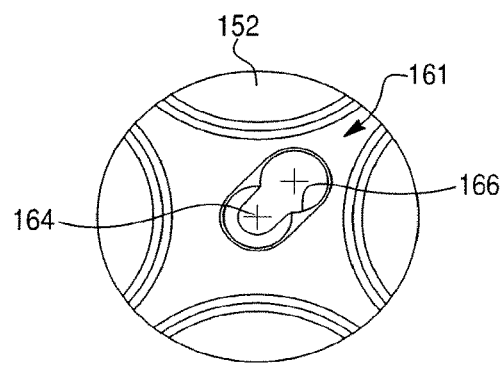
FIG. 4(b) is an enlarged view of a portion of the alignment assembly shown in FIG. 4(a).

In this example, cylindrical caps are affixed at the ends 159, 160 of the wire 157. As shown in FIGS. 4(a) and (b), the top plate 152 includes a center hole 164 adjoining an offset hole 166. The cap on the end 159 of the wire 157 may be inserted into the offset hole 166 and moved laterally to lock within the center hole 164. Corresponding center and offset holes may be provided in the bottom plate 153 to lock the wire 157 in a similar manner. It should be understood, of course, that the ends 159, 160 of the wire 157 may be affixed in other different ways. For example, ends of a wire could be pinned or affixed with various other mechanisms known in the art, including those that would allow a degree of lateral movement or rotation between the wire or other beam and the member to which the wire or other beam is affixed.

In this particular example, the wire 157 has a round cross-section and is about 30 mils in diameter ($30/1000$ inch), is approximately 1 inch long. Compressive forces applied by the wire 157 may range from about 5 to 80 pounds. In other embodiments compressive forces may exceed 150 pounds, such as about 160 pounds. The wire 157 is adapted to retain or lift a force of at least 150 pounds, such as around 20 pounds. It will be appreciated, however, that the specific material properties and geometric dimensions of the wire 157 may be adapted based on operating conditions. The wire 157 may be made from a variety of materials, but is preferably a metal, such as high strength steel.

As further shown in FIG. 3, this particular embodiment includes four compressible fluid bellows 151A and 151B arranged concentrically around the wire 157 such that the longitudinal axes of the fluid bellows 151A and 151B are parallel to the longitudinal axis of the wire 157. Specifically, the bellows 151A and 151B are arranged at four positions, spaced apart radially at 90° around the wire 157 at equal distances from the wire 157. In this example, bellows 151A provide an inlet channel for constant temperature liquid, while bellows 151B provides an outlet channel. Each of the pair of inlet bellows 151A is positioned 180° relative to the other; similarly, each of the pair of outlet bellows 151B is positioned 180° relative to the other. In at least some typical applications, the inlet pressure is not equal to the return pressure. With the arrangement shown, placement of the bellows 151 tends to cancel the effect of this pressure difference. Further, the bellows 151 preferably have a small spring rate such that the moments and forces created by them during rotation and displacement of the thermal unit has negligible affect on the force center.

One particular use of the thermal assembly 100 is to regulate the temperature of an integrated circuit device (IC device), while the IC device is being tested in a chip testing system. In such a chip testing system, the IC device is commonly referred to as a device under test or "DUT." Such technology is generally described in U.S. Pat. No. 7,243,704 ("the '704 patent"). In such technology, the input/output terminals of the DUT are connected electrically with a test unit, either directly or though a substrate on which the DUT is attached. The thermal assembly applies a force, ideally to a central portion on the surface of the DUT in a direction normal to the surface, so as to place a heat exchanger or other thermal control element in contact with the DUT.

Initially, the thermal assembly 100 is spaced apart from the DUT, and ideally the contact surface of the thermal assembly 100 (e.g., face of a heat exchanger coupled to the underside of bottom plate 153) and the contact surface of the DUT lie in parallel planes.

Figure 6:
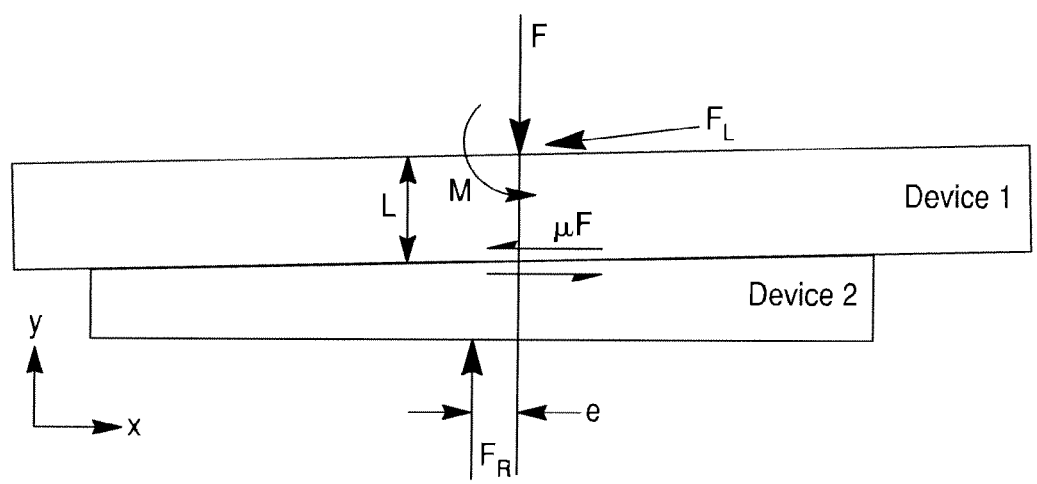
FIG. 6 generally illustrates the manner by which a beam may be used to transmit a normal force component through a first device to a center portion of the surface of a second device.

However, due to cumulative effects of various imprecise dimensional tolerances of components in the system, these contact surfaces may be misaligned, such as disposed at an angle relative to each other (see generally devices 1 and 2 as shown in FIG. 6).

FIGS. 5(a) and 5(b) are simplified cross-sectional views of an assembly that includes a thermal assembly 100 (described in greater detail above) to which is affixed a heat exchanger 220. The thermal assembly 100 includes an alignment assembly 150, which in turn includes the wire 157 and bellows 151. The lower end 160 of the wire 157 is affixed to the bottom plate 153. Affixed below the bottom plate 153 are the manifold 114 and flow adapter 115 (see FIG. 2). In this example, these are in fluid communication with a heat sink 224 disposed within the heat exchanger 220. A heating element 222 (e.g., thin heating element, thin film heating element) is coupled to (e.g., disposed over) the heat sink 224, in this example, at the bottom of the thermal assembly 100. The surface of the heat exchanger device 220 is configured to contact a surface of a semiconductor device 250, such that the heating element 222 is interposed between the heat sink 224 and the semiconductor device 250. As illustrated, the semiconductor device 250 is disposed in a socket 255, such as a socket of a test unit.

In operation, the surfaces of the semiconductor device 250 and the heat exchanger 220 may not be parallel with one another. This misalignment may result in poor thermal conductivity between the heat exchanger and the device, at least in part due to an uneven pressure distribution therebetween. If additional force is applied downward to increase thermal conductivity, there is a risk of damage to the device 250 through cracking or plastic deformation at least in part due to associated stress concentrations and temperature variations.

As illustrated in FIG. 5(b), these problems are substantially overcome by use of an alignment mechanism according to an embodiment of the invention. As illustrated, as force is applied downward, the wire 157 applies a force component normal to the surface of the device 250. The wire 157 is able to laterally deflect by an amount sufficient to allow movement in directions orthogonal to this normal force component. As a result the upper portion of the heat exchanger 220 may be moved into alignment with the device 250 and a normal force component may be applied uniformly to the surface of the device 250. In contemplated embodiments, the magnitude of lateral displacement, orthogonal to the normal force component, may be limited in order to prevent an orientation of the wire that could result in slipping of the heat exchanger 220 relative to the device 250, such as where transverse loading exceeds the static friction threshold between contact surfaces of the heat exchanger and device 250.

FIG. 6 provides a two-dimensional theoretical model intended to more generally illustrate the manner by which forces interact in a contact. If the contact surface of a first device DEVICE 1 (e.g., thermal head) and the contact surface of a second device DEVICE 2 (e.g., device under test) are aligned with one another in parallel engagement, then the force F (e.g., engagement force) exerted by the beam, provided through the first device DEVICE 1, is matched equally and oppositely by the reaction force $F_R$ provided through the second device DEVICE 2, and the forces F, $F_R$ are substantially collinearly aligned with one another in the center of the device. As a result, the contact has a uniform pressure distribution, which may provide a uniform thermal resistance across the contact.

If the first device DEVICE 1 is not aligned with the second device DEVICE 2 (e.g. the two surfaces are not parallel), then the force F exerted by the beam will be misaligned with the reaction force $F_R$ provided through the second device DEVICE 2. Furthermore, for the contact surfaces of DEVICE 1 and DEVICE 2 to come into intimate and parallel contact without DEVICE 1 and DEVICE 2 sliding relative to one another, the position of the point where the beam (e.g., wire) and DEVICE 1 are joined must move laterally. For this to happen the end of the beam contacting DEVICE 1 must be relatively free to move in the lateral direction, where the beam must not exert excessive lateral force on DEVICE 1. Accordingly, application of the force F will produce a lateral component $F_L$ and a moment M, offsetting the center of force applied by the first device DEVICE 1 to the second device DEVICE 2. The lateral component $F_L$ will be countered by static frictional forces $\mu \times F$, unless $F_L$ exceeds the static friction threshold, which will result in slip between the contact surfaces. The following theoretical model, in static equilibrium where the sums of forces and moments are zero, provides a useful summary of the misaligned interaction:

$F_y=0$ because $F=F_R$ (5)

$F_x=0$ because $F_L \leq \mu F$ (otherwise slip will occur)

$\Sigma M=0$ because $M+F_L \times L = F \times e$, where $e$ is the distance of the force offset. (10)

Due to design constraints in some embodiments, L cannot be reduced below a significant distance (e.g., an inch). However, embodiments of the present invention include a beam that can react to an offset in the forces F, $F_R$ with negligible resistance due to friction or elastic deformation. With embodiments that include the wire 157 discussed above, ends 159, 160 of the wire 157 outside of the tube 158 are configured to bend under relatively light loading. Under compression, such a beam may be even more compliant in the lateral direction.

Embodiments of the present invention may be used to transmit a sufficient normal force component to ensure sufficient contact between a first device (e.g., a thermal control unit) and a second device (e.g., a semiconductor device), so as to reduce thermal resistance between the two surfaces, while reducing displacement between the two surfaces. Embodiments of the invention minimize the amount that a resultant force applied to a device surface is away from the theoretical center. By reducing lateral force and the moments that the beam exerts on a first device, the amount that the resultant force is off center is also reduced.

Although embodiments of present invention may be used advantageously in connection with a thermal head assembly that regulates the temperature of a semiconductor device under test, it will be appreciated, however, that the invention is not necessarily limited to this application. Other types of thermal control devices known in the art may be utilized, such as a heat sink, a Peltier device, etc. Further, the alignment assembly may be utilized in a variety of environments. For example, an alignment assembly according to the invention could be utilized to control temperature during normal operation of a semiconductor device (such as in a server).

One versed in the art would appreciate that there may be other embodiments and modifications within the scope and spirit of the disclosure. Accordingly, all modifications attainable by one versed in the art from the present disclosure, within its scope and spirit, are to be included as further embodiments of the present disclosure. The scope of the following claims and their equivalents is intended to cover such embodiments, modifications, and alternative designs.

What is claimed is:

1. A mechanism comprising:
a mount having a top plate;
a bottom plate;
a beam having a first end affixed to the mount and a second end, the beam being an order of magnitude more rigid along its longitudinal axis than along an axis orthogonal to its longitudinal axis; and
a first device to which the second end of the beam is affixed, the first device having a surface configured to contact a second device;
a first compressible fluid tube extending between the top plate and the bottom plate, the first compressible fluid tube having a longitudinal axis that is parallel to the longitudinal axis of the beam, the first compressible fluid tube separated from the beam by a first distance; and
a second compressible fluid tube extending between the top plate and the bottom plate, the second compressible fluid tube having a longitudinal axis that is parallel to the longitudinal axis of the beam, the second compressible fluid tube separated from the beam by a second distance equal to the first distance;
wherein the beam applies an orthogonal force to the second device through the first device and allows movement at the second end in directions orthogonal to the longitudinal axis of the beam; and
wherein the beam is stiff enough along its longitudinal axis to transmit the orthogonal force along its longitudinal axis to the second device without the beam buckling.

2. The mechanism of claim 1, wherein the beam is a wire.

3. The mechanism of claim 2, wherein the wire is provided within a tube, said tube being configured to prevent the wire from buckling beyond a predetermined amount.

4. The mechanism of claim 1, wherein the first device is a thermal control device and the second device is a semiconductor device.

5. The mechanism of claim 4, wherein the thermal control device is a heat exchanger.

6. The mechanism of claim 5, wherein the heat exchanger includes a fluid channel through which fluid flows, wherein the fluid assists in regulating a temperature of the semiconductor device while the surface of the first device that is the heat exchanger is in contact with the semiconductor device.

7. The mechanism of claim 6, wherein the fluid channel runs through a heat sink, and the heat exchanger further includes a heater element disposed between the heat sink and the surface of the heat exchanger that contacts the semiconductor device.

8. The mechanism of claim 7, wherein the semiconductor device is a device under test, and the heat exchanger is configured to maintain the semiconductor device at or near a setpoint temperature.

9. The mechanism of claim 8, wherein the mount is coupled to a housing that is affixed to a handler device, the handler device being configured to: receive the semiconductor device, present the semiconductor device to a test unit for testing and remove the semiconductor device from the test unit after testing.

10. The mechanism of claim 1, wherein the mount is coupled to a housing via a piston configured to provide a force in a direction parallel to the orthogonal force, so as to move the first device in contact with the second device.

11. The mechanism of claim 4, wherein the beam is configured to support and lift the thermal control device.

12. The mechanism of claim 4, wherein the thermal control device includes an air cooled heat sink.

13. The mechanism of claim 6, wherein the thermal control device includes an evaporator.

14. The mechanism of claim 7, wherein the thermal control device includes an evaporator.

15. The mechanism of claim 1 wherein the beam requires less than one tenth an amount of force required to provide a longitudinal displacement of the second end in order to provide a lateral bending displacement of the second end of equal magnitude to the longitudinal displacement.

16. The mechanism of claim 15, wherein the beam requires less than one hundredth the amount of force required to provide a longitudinal displacement of the second end in order to provide a lateral bending displacement of the second end of equal magnitude to the longitudinal displacement.

17. The mechanism of claim 1, wherein the beam is a rod.

18. The mechanism of claim 1, wherein the beam is a solid, rigid beam.

19. The mechanism of claim 1, wherein, if unrestrained, the beam is configured to deform under sufficient load from a straight shape to include at least a U-shape.

20. The mechanism of claim 1, wherein the beam is a structural beam configured to bend more easily along the axis orthogonal to its longitudinal axis than a direction along its longitudinal axis.

21. The mechanism of claim 1, wherein the beam is flexible enough to allow movement in all directions parallel to a surface of the second device, wherein the surface of the second device is contacted by the first device.

22. The mechanism of claim 1, wherein a first cap is affixed to the first end of the beam and a second cap is affixed to the second end of the beam.

23. The mechanism of claim 22, wherein the mount includes a center hole and an offset hole, wherein center hole adjoins the offset hole such that the first cap is configured to be inserted into the offset hole and moved laterally to lock within the center hole.

24. The mechanism of claim 3, wherein the tube has a length shorter than the beam such that there are gaps between the first end and the second end of the beam and respective ends of the tube.

25. The mechanism of claim 3, wherein the beam is longer than the tube such that a portion of the beam extending beyond the tube is less restricted and is bendable while the beam is within the tube.

26. The mechanism of claim 3, wherein at least one of the first end and the second end of the beam extends beyond the tube such that at least one of the first end and the second end is bendable while the beam is within the tube.

27. A mechanism comprising:
a top plate;
a bottom plate;
a beam having a first end affixed to the top plate and a second end affixed to the bottom plate, the beam being an order of magnitude more rigid along its longitudinal axis than along an axis orthogonal to its longitudinal axis;
a first compressible fluid bellows extending between the top plate and the bottom plate, the first compressible fluid bellows having a longitudinal axis that is parallel to the longitudinal axis of the beam, the first compressible fluid bellows separated from the beam by a first distance; and
a second compressible fluid bellows extending between the top plate and the bottom plate, the second compressible fluid bellows having a longitudinal axis that is parallel to the longitudinal axis of the beam, the second compressible fluid bellows separated from the beam by a second distance equal to the first distance.

28. A mechanism comprising:
a top plate;
a bottom plate;
a rod having a first end affixed to the top plate and a second end affixed to the bottom plate, the rod being an order of magnitude more rigid along its longitudinal axis than along an axis orthogonal to its longitudinal axis;
a first compressible fluid bellows extending between the top plate and the bottom plate, the first compressible fluid bellows having a longitudinal axis that is parallel to the longitudinal axis of the rod; and
a second compressible fluid bellows extending between the top plate and the bottom plate, the second compressible fluid bellows having a longitudinal axis that is parallel to the longitudinal axis of the rod.

* * * * *